(12) United States Patent
Michii et al.

(10) Patent No.: US 6,545,366 B2
(45) Date of Patent: Apr. 8, 2003

(54) MULTIPLE CHIP PACKAGE SEMICONDUCTOR DEVICE

(75) Inventors: Kazunari Michii, Tokyo (JP); Tatsuhiko Akiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/887,164

(22) Filed: Jun. 25, 2001

(65) Prior Publication Data

US 2002/0089050 A1 Jul. 11, 2002

(30) Foreign Application Priority Data

Jan. 11, 2001 (JP) ........................................ 2001-003934

(51) Int. Cl.[7] .............................................. H01L 23/48
(52) U.S. Cl. ........................ 257/777; 438/108; 361/768
(58) Field of Search ................................. 257/738, 686, 257/777, 778; 438/108; 361/717, 718, 768, 723

(56) References Cited

U.S. PATENT DOCUMENTS 5,483,024 A * 1/1996 Russell et al. ............. 174/52.4
6,100,594 A 8/2000 Fukui et al.
6,118,176 A * 9/2000 Tao et al. .................... 257/676
6,157,080 A * 12/2000 Tamaki et al. .............. 257/738

FOREIGN PATENT DOCUMENTS

EP 0 810 655 A 12/1997
JP 10-92972 A 4/1998

* cited by examiner

Primary Examiner—William David Coleman
(74) Attorney, Agent, or Firm—Leydig, Voit & Mayer, Ltd.

(57) ABSTRACT

In order to reduce the thickness of a semiconductor device and double its capacity, two center pad semiconductor chips stacked one on the other, back to back, are fixed to one face of a wiring substrate. The difference in the length of routing between external lands and fingers is minimized, and each of the center pads and corresponding fingers are connected via metal wires having a high conductivity. The main face of a first center pad semiconductor chip is fixed to the wiring substrate that has first and second wired faces and a through opening. The back face of the first semiconductor chip and the back face of a second semiconductor chip are fixed to each other using a bonding material. The pads on each semiconductor chip are connected to corresponding fingers on the wiring substrate via metal wires. One face of the wiring substrate is sealed with a sealing resin, and on the other face, an area in the vicinity of the through opening is sealed.

12 Claims, 10 Drawing Sheets

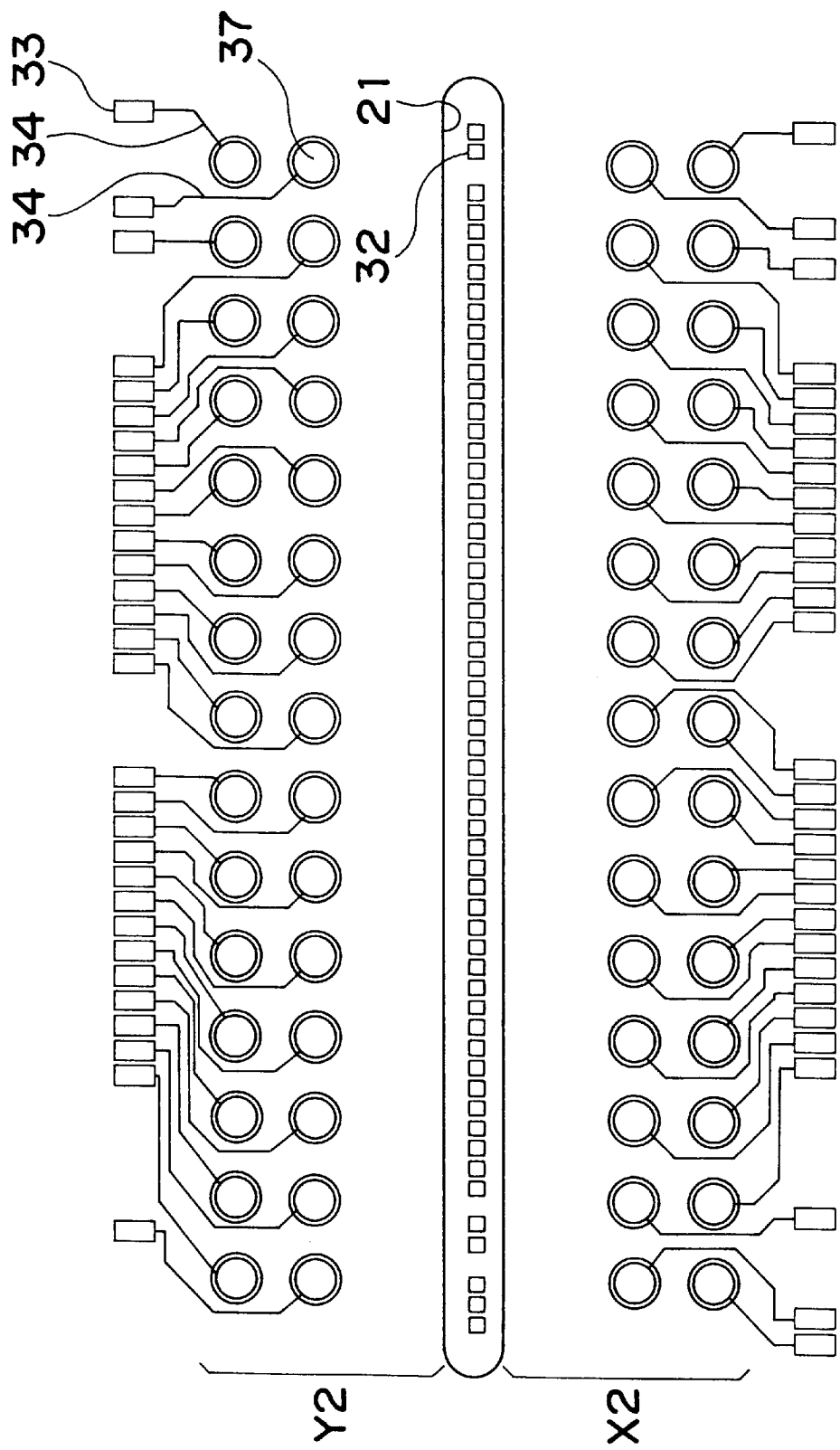

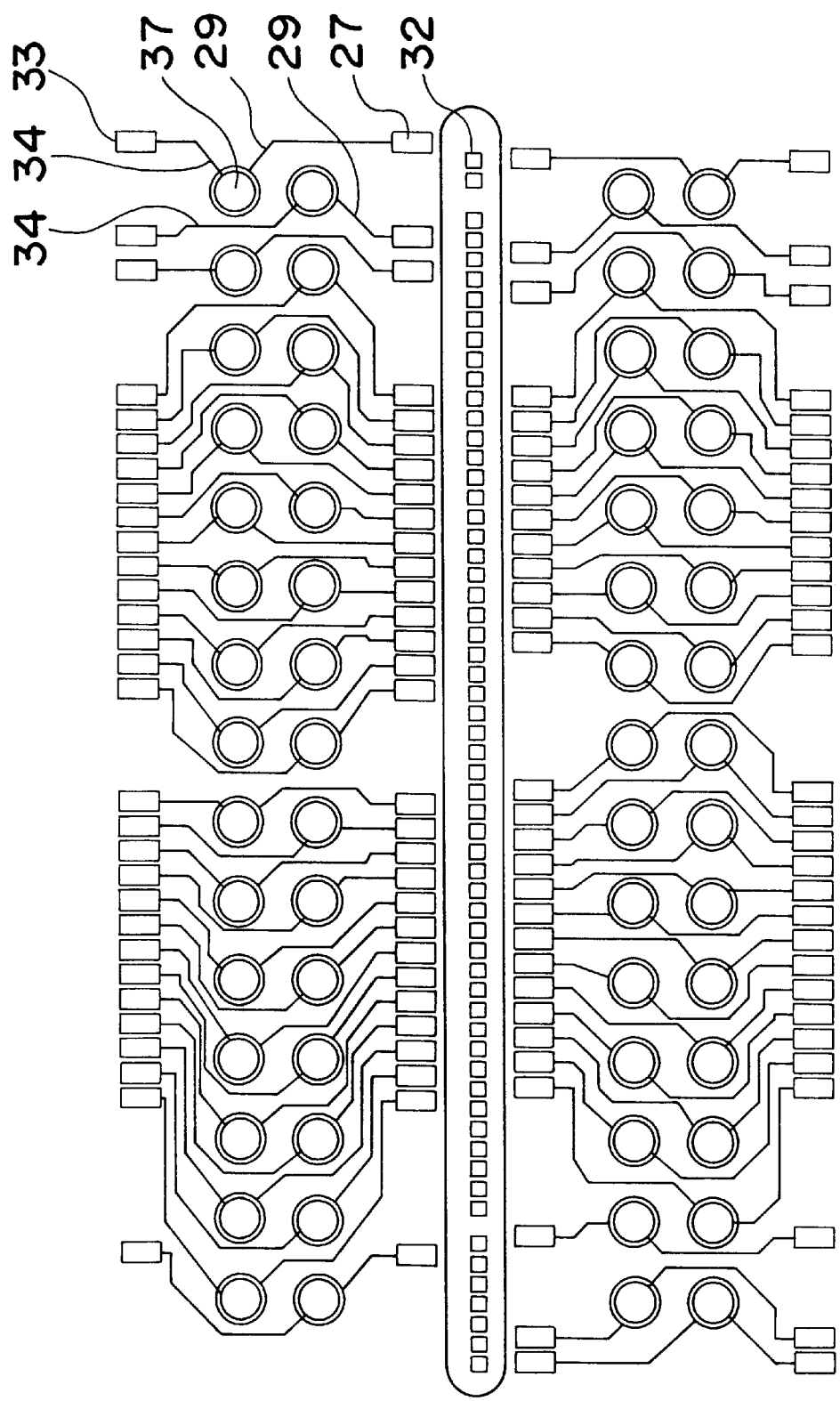

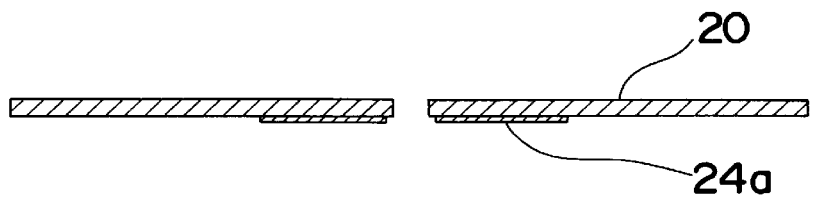
Fig.5A
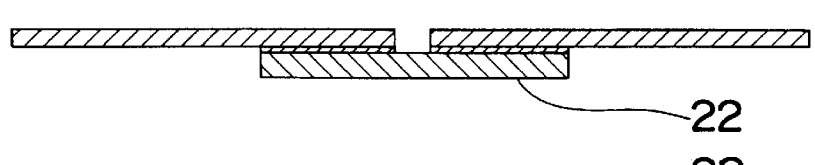
Fig.5B
Fig.5C
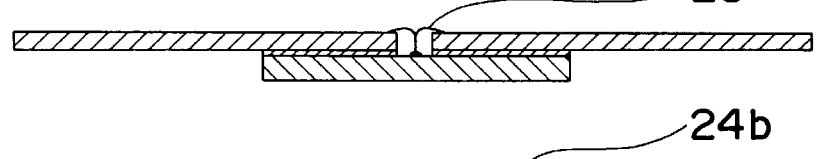
Fig.5D
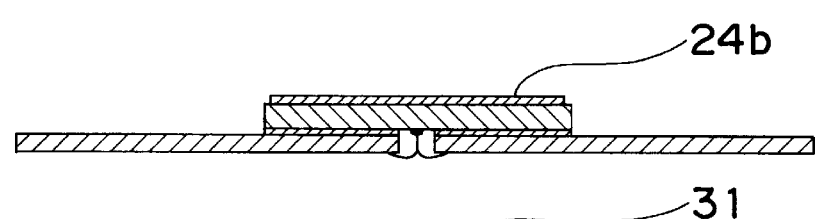
Fig.5E
Fig.5F
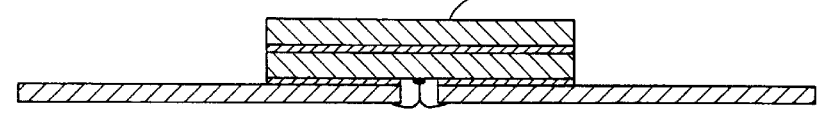
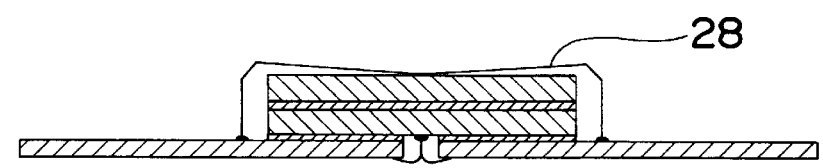
Fig.5G
Fig.5H
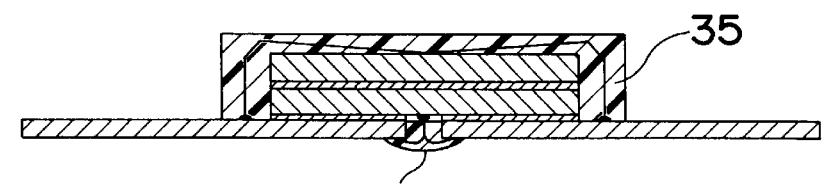
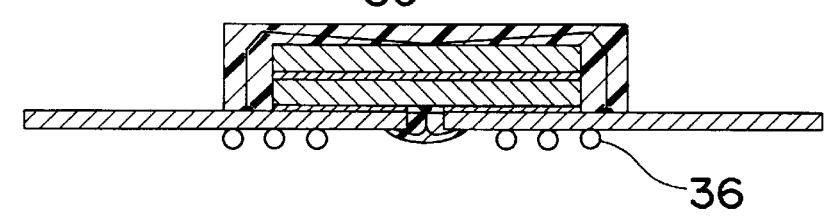
Fig.5I
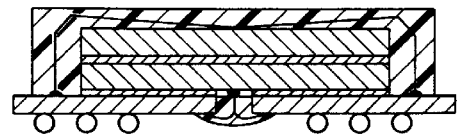

MULTIPLE CHIP PACKAGE SEMICONDUCTOR DEVICE

BACKGROUND OF THE INVENTION

The present invention relates to a semiconductor device using integrated circuits (IC) in which higher capacity, speed, and downsizing can be accomplished.

With a request of higher density packaging of semiconductor devices on a printed circuit board, a downsized semiconductor device sealed into a substantially semiconductor chip size that is called a chip scale package or chip size package (CSP) has been developed. In addition to the downsizing of a semiconductor device having one of such memory semiconductor devices or peripheral circuit semiconductor devices sealed therein (referred to as a single semiconductor device), a multi chip package (MCP) having a plurality of memory semiconductor chips sealed by a single sealing material has been developed for higher density packaging of semiconductor devices on a printed circuit board.

Regarding the method of sealing such a plurality of semiconductor chips with a single sealing material, horizontal arrangement of the chips makes the area occupied by the chips on the mounting substrate larger. For this reason, disclosed in JP, 11-204720, A are a stacked multi chip package (SMCP) having two semiconductor chips having peripheral electrode pads stacked one on the other with their main faces placed in the same direction, and another SMCP having two semiconductor chips having peripheral electrode pads stacked one on the other back to back with one main face placed upward and the other main face downward.

FIG. 9 shows a cross sectional view of a conventional SMCP having two semiconductor chips having peripheral electrode pads stacked one on the other with their main faces placed upward in the same direction. FIG. 10 shows a cross sectional view of a conventional SMCP that has two semiconductor chips of the same outside dimension having peripheral electrode pads stacked back to back with one main face placed upward and the other main face downward. FIG. 11 is a top plan view of a wiring substrate used for a conventional SMCP.

Referring to FIG. 9, a first semiconductor chip 1 having peripheral electrode pads 13 and a second semiconductor chip 2 smaller than the placement area of the peripheral pads 13 and having peripheral electrode pads 12 are fixed via a bonding layer 7. The back face of the first semiconductor chip 1 is fixed to one side of an insulating substrate 3 having a wiring layer 4 formed thereon (front face), via a bonding layer 7. The insulating substrate has the wiring layer 4 on one side. Using soldering paste, mounting bumps 10 are joined to lands 15 exposed from the back face of the insulating substrate 3 through through-holes 11 that are provided so as to correspond to the lands 15 arranged on the front face of the insulating substrate 3.

Peripheral pads 13 and 12 on first and second semiconductor chips 1 and 2, respectively, are electrically connected to fingers 14 via gold wires 8 using the ultrasonic thermocompression wire bonding method. All of the semiconductor chips 1 and 2, the bonding layers 7 and gold wires 8, and also predetermined face and portions of insulating substrate 3 and wiring layer 4 are sealed with resin.

FIG. 11 is a top plan view of a conventional insulating substrate 3 having a wiring layer 4 formed on only one side. The wiring layer 4 is composed of a successive pattern having fingers 14, routing 16 and 17, and lands 15 corresponding to one another. In this drawing, the fingers 14 are placed along the two sides of the peripheral areas of semiconductor chips 1 and 2. The lands 15 are arranged in two central lines and in two lines each disposed outside of the two central lines at an equal pitch, i.e. in four lines in total, within the area in which the first semiconductor chip 1 is placed. Such an arrangement makes the routing 17 connecting the two central lines of the lands 15 and the corresponding fingers 14 longer than the routing 16 connecting the outside lines of the lands 15 and the corresponding fingers 14. This causes a drawback of difference in their impedance.

When two conventional semiconductor chips 1 and 2 of the same outside dimension each having peripheral electrode pads 13 and 12 are stacked back to back with one main face placed upward and the other main face downward as shown in FIG. 10, the peripheral electrode pads must be placed in vertically inverted positions. The conventional SMCP has another drawback. Since metal bumps 6 of a diameter larger than the thickness of bonding material 7 are used for the connection between peripheral electrode pads 13 and corresponding fingers 14, the SMCP becomes thicker by the size of bumps. In addition, since the SMCP is composed of semiconductor chips 1 and 2 having peripheral electrode pads 12 and 13 and a wiring substrate 3 shown FIG. 11, routing 17 connecting two central lines of lands 15 and corresponding fingers 14 is longer than routing 16 connecting two outside lines of lands 15 and corresponding fingers 14. This causes another drawback of difference in their impedance on the wiring substrate.

As mentioned above, the conventional SMCP has a drawback that the semiconductor device placed on a mounting substrate has a larger thickness when mounted because semiconductor chips are stacked one on the other.

In addition, the conventional SMCP has another drawback. For example, two DRAM chips of the same dimension, each having a single line of electrodes or a plurality of lines of electrodes along the centerline of the semiconductor chip (referred to as a center pad arrangement semiconductor chip), are stacked one on the other so as to double memory capacity thereof. Such kind of SMCP cannot be constructed because wire bonding brings the wires into contact with the periphery of second semiconductor chip 2 (referred to as a chip edge short circuit).

Moreover, when a center pad arrangement semiconductor chip and a peripheral pad arrangement semiconductor chip of the same dimension are stacked one on the other, routing for connecting to the same lands 15 is more complicated and longer because of the inverted pads. This inhibited the accomplishment of higher speed, capability, and memory capacity.

SUMMARY OF THE INVENTION

The present invention addresses the above-mentioned problems. Therefore, the first object of the present invention is to provide a thin SMCP having two center pad arrangement semiconductor chips stacked one on the other so as to double memory capacity. The second object of the present invention is to reduce the difference in the impedance of routing between electrode pads and fingers by minimizing the difference in the length of routing between the electrode pads and fingers on the wiring substrate and using gold wires of high conductivity for connecting the center pads on each of the stacked chips and corresponding fingers.

A semiconductor device in accordance with a first aspect of the present invention has a wiring substrate having a through opening, and having lands, fingers, routing, and through holes on a first face and a second face thereof. A first semiconductor chip having center pads on the main face thereof is fixed to the wiring substrate on the second face thereof using bonding material so that the through opening surrounds the center pads. The back face of the first semiconductor chip and the back face of a second semiconductor chip are fixed to each other using bonding material. The pads on each semiconductor chip and corresponding fingers on the wiring substrate are connected via gold wires. The gold wires, each semiconductor chip, each bonding material, and the through opening are filled with sealing resin. In addition, the fingers on the first face in an area other than from land placement areas to peripheral areas are also sealed. Such a structure can make the entire thickness of the SMCP smaller.

The semiconductor device also has solder balls on the lands provided on the first face of the wiring substrate. Thus, mounting the device on a mounting substrate is more efficient.

The semiconductor device also has the first and second semiconductor chips identical with each other. Such a structure can double its capacity.

With the semiconductor device, the center pads on the first semiconductor chip are connected to the fingers on the first face of the wiring substrate via gold wires by ball bonding onto the center pads and by stitch bonding onto the fingers. The fingers on the second face of the wiring substrate are electrically connected to the pads on the second semiconductor chip via gold wires by ball bonding onto the fingers and stitch bonding onto the pads. Such connection can make the height of the SMCP smaller.

With the semiconductor device, the first face of the wiring substrate has fingers provided in the vicinity of and substantially in parallel with the through opening, and lands arranged outside of and in parallel with the fingers at equal spaces. The second face of the wiring substrate has fingers provided in the vicinity of and substantially in parallel with the periphery of the wiring substrate, and lands arranged inside of and in parallel with the fingers at equal spaces. Such an arrangement can make the length of routing between lands and fingers substantially equal and thus make the impedance substantially equal.

The wiring substrate has the lands arranged at equal spaces and in parallel with one another in the areas between the fingers provided in the vicinity of, along and substantially in parallel with the through opening and the fingers in the vicinity of, along and substantially in parallel with the periphery of the wiring substrate. Such an arrangement can make the impedance of all wiring substantially equal. In addition, the wiring can be formed on a single layer.

A semiconductor device has a wiring substrate with a through opening having a first face and second face. The second face has two kinds of surfaces: a frame-like projected surface surrounding on the peripheral area of the second face; and a depressed surface lower than the projected surface. The wiring substrate has lands, fingers, routing, and through holes placed on the first face and second face thereof. The substrate and two semiconductor chips having center pads thereon are fixed to one another by bonding material with the back face of the chip is fixed to the back face of the other chip. The second main face of the semiconductor chip is placed substantially flush with the projected surface and a first main face of the semiconductor is fixed to the depressed surface of the second face of the substrate using boding material with the through opening surrounding the center pads. The center pads on the semiconductor chips are electrically connected to the fingers on the wiring substrate via gold wires by ball bonding onto the center pads and by stitch bonding onto the fingers. The gold wires, each semiconductor chip, each bonding material, and the second face of the wiring substrate are sealed with a sealing resin. The through opening, and fingers on the first face of the wiring substrate in an area other than from land placement areas to peripheral areas are also sealed. Such a structure can provide an SMCP at a lower price.

The semiconductor device also has solder balls on the lands provided on the first face of the wiring substrate. Thus, a device easily mounted on a mounting substrate can be obtained.

BRIEF DESCRIPTION OF THE DRAWINGS

FIG. 3 is a top plan view of a wiring pattern provided on a second face of the wiring substrate used for the semiconductor device shown in FIG. 1;

FIG. 4 is a top plan view of a wiring pattern of the wiring substrate used for the semiconductor device shown in FIG. 1;

FIGS. 5A–5I are a manufacturing flow chart of the semiconductor device shown in FIG. 1;

DETAILED DESCRIPTION OF THE PREFERRED EMBODIMENTS

Embodiment 1

Figure 1:
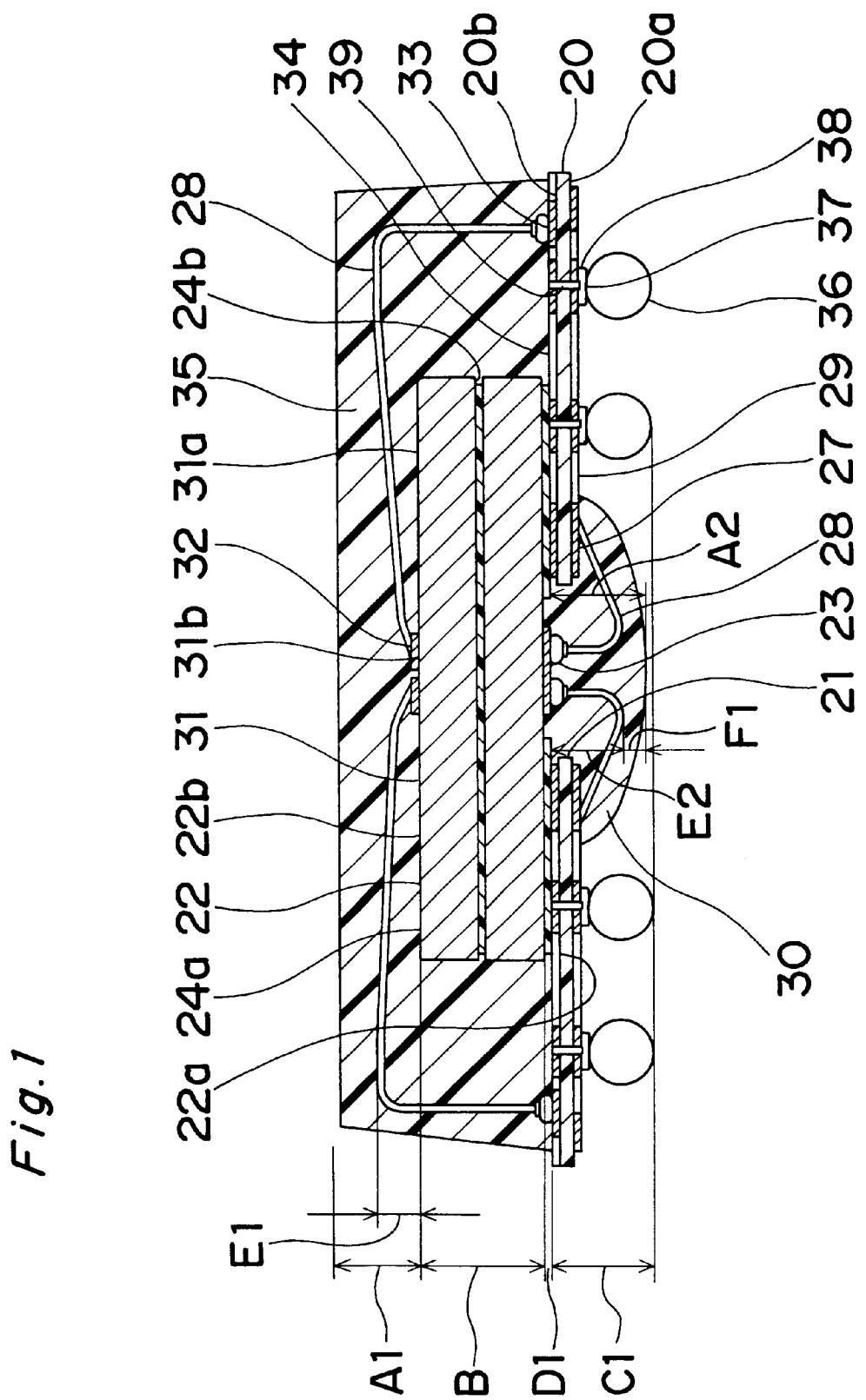
FIG. 1 is a cross sectional view illustrating the structure of a semiconductor device in accordance with Embodiment 1.

FIG. 1 shows a semiconductor device in accordance with a first exemplary embodiment. In the drawing, a through opening 21 of a wiring substrate 20 having the first face 20a and second face 20b are placed so as to correspond to a center pad 23 placement area on a first semiconductor chip 22. The portion other than the center pad 23 placement area provided on the main face 22a of the first semiconductor chip 22 are bonded to the second face 20b of the wiring substrate 20 via bonding material 24a. The back face 22b of the first semiconductor chip 22 and the back face 31b of a second semiconductor chip 31 are bonded together via bonding material 24b. Thus, the wiring substrate 20, first and second semiconductor chips 22 and 31 are integrally fixed to one another.

The center pads 23 provided on the main face 22a of the first semi conductor chip 22 are connected to corresponding fingers 27 provided on the first face 20a of the wiring substrate 20 via metal wires 28 by ball bonding onto center pads 23. The metal wires 28 pass through the through-opening 21 provided in the central area of the wiring substrate 20 and then are electrically connected to the fingers 27 provided on the first face 20a of the wiring substrate 20 by stitch bonding onto the fingers. The metal wires 28, entire through opening 21 in the wiring substrate 20, and fingers 27 and a part of routing 29 on the first face 20a of the wiring substrate 20 are sealed with sealing resin 30.

Center pads 32 provided on the main face 31a of the second semiconductor chip 31 are electrically connected to corresponding fingers 33 provided on the second face 20b of the wiring substrate 20 via metal wires 28 by ball bonding onto the fingers 33 and by stitch bonding onto the center pads 32. The metal wires 28, second semiconductor chip 31, first semiconductor chip 22, bonding material 24a and 24b, fingers 33, routing 34, and a predetermined part of the second face 20b of the wiring substrate 20 are sealed with the sealing resin.

Solder balls for mounting the above semiconductor device onto a motherboard may be provided on the motherboard side. Alternatively, as shown in Embodiment 1, the solder balls may be mounted on external electrode lands 37 beforehand. Solder balls 36 are connected to external electrode lands 37 provided on the first face 20a of a wiring substrate 20 via soldering paste 38. Fingers 33 provided on the second face are electrically connected to routing 34, through holes 39 provided through the wiring substrate 20 and external electrode lands 37 provided on the first face 20a, and as required, to routing 29 through the external electrode lands 37 provided on the first face 20a and soldering paste 38.

Figure 2:
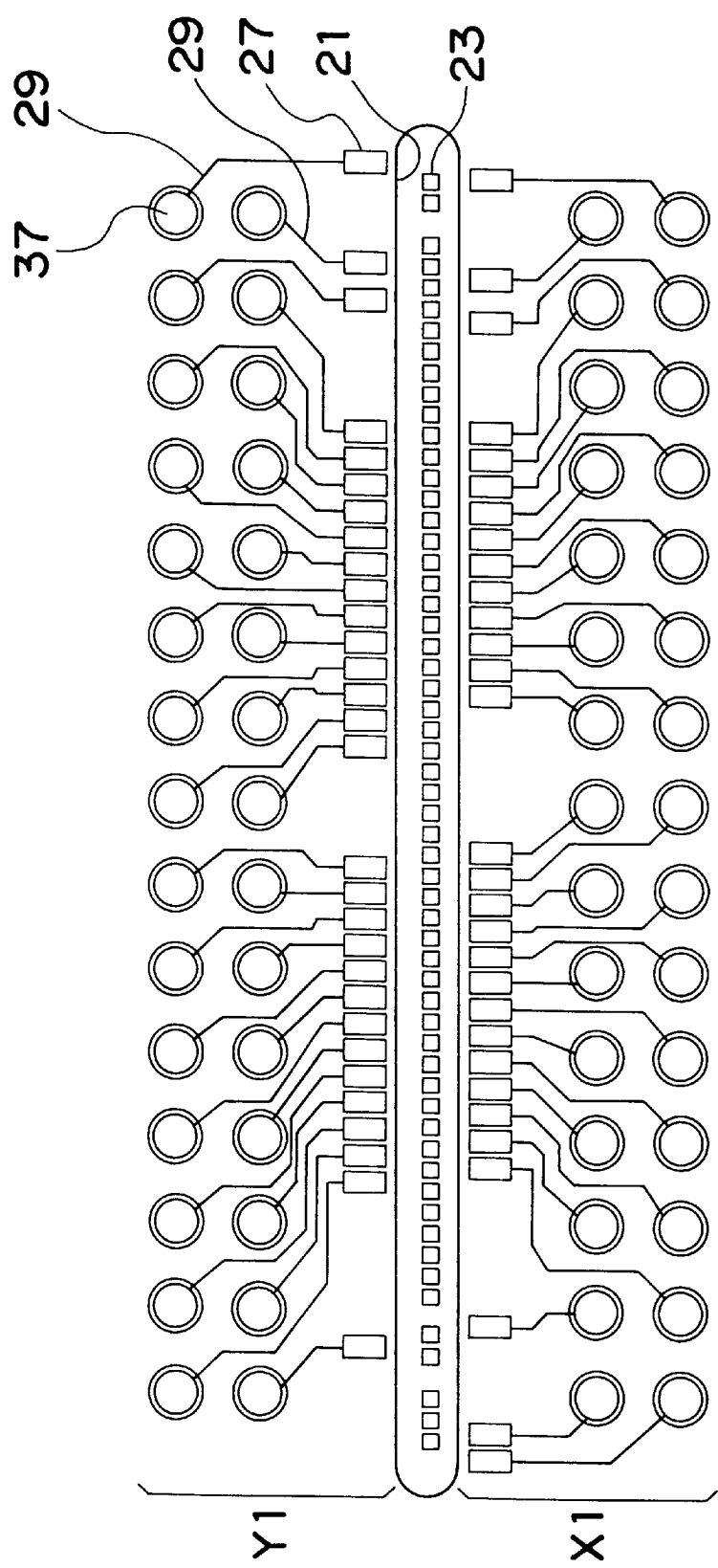
FIG. 2 is a top plan view of a wiring pattern provided on a first face of a wiring substrate used for the semiconductor device shown in FIG. 1.

Next, the wiring substrate used in the semiconductor device shown in Embodiment 1 is described below. FIG. 2 is a top plan view illustrating through opening 21, fingers 27, external electrode lands 37, and routing 29 provided on the first face 20a of a wiring substrate 20. (Through holes 39 are not shown as they can be made in portions on the substrate with a sufficient space using any kind of component selected among lands 37, routing 29, and fingers 27.) Since semiconductor chips 22 and 31 are fixed back to back, the relation between center pads 23 and fingers 27 is vertically inverted. Therefore, the drawing shows an example of the arrangement with respect to center pads 23 that are provided on a semiconductor 22, for explanation. (Metal wires 28 are omitted and not shown.)

FIG. 3 is a top plan view illustrating a through opening 21, fingers 33, external electrode lands 37, and routing 34 provided on the second face 20b of wiring substrate 20. FIG. 3 does not show through holes in the same manner of FIG. 2 and illustrates the arrangement of center pads 32 provided on semiconductor chip 31, in association with FIG. 2. The center pad arrangements shown in FIGS. 2 and 3 that illustrates wiring patterns used for Embodiment 1 are only examples and the center pads are not necessarily arranged in a line along the centerline of the semiconductor chip. The center pads can be distributed in the vicinity of the centerline of a semiconductor chip 22. It is sufficient that required center pads be surrounded by a through opening 21. FIG. 4 shows a top plan view in which patters shown in FIGS. 2 and 3 are formed in a single layer. The wiring pattern of FIG. 4 can be provided on the first and second faces.

Next, the method of producing the pattern of FIG. 3 based on that of FIG. 2 is described below. In FIG. 2, fingers 27, external electrode lands 37 and routing 29 illustrated in the area above center pads 23 are indicated by Y1. Fingers 27, external electrode lands 37 and routing 29 illustrated in the area below center pads 23 are indicated by X1.

In FIG. 3, fingers 33, external electrode lands 37 and routing 34 illustrated in the area above center pads 32 are indicated by Y2. Fingers 33, external electrode lands 37 and routing 34 illustrated in the area below center pads 32 are indicated by X2.

When a first semiconductor chip 22 and a second semiconductor chip 31 is fixed back to back, the patterns can be placed in two ways. One is to vertically invert the pattern and the other is to horizontally invert the pattern with respect to center pads 23 of FIG. 2. When the pattern of FIG. 2 is vertically inverted, pattern X1 is placed above center pads 23 and pattern Y1 is placed below the center pads 23. Translating pattern X1 above center pads 23 upward and pattern Y1 below the center pads 23 downward in this condition until external electrode lands 37 correspond to one another will determine the positions of fingers 33 and external electrode lands 37 shown in FIG. 3. However, routing 34 must be remade as shown in FIG. 3. Routing 29 on the first face of wiring substrate connects fingers 27 and corresponding external electrode lands 37. Therefore, proper connection cannot be made in this condition because fingers 33 and corresponding external electrode lands 37 are placed in a vertically inverted manner.

The following steps are taken to make routing 34. Superimpose the pattern of FIG. 2 on the vertically inverted pattern of FIG. 2 on a PC screen so that external electrode lands 37 of each pattern correspond to each other according to the above-mentioned procedure. Then remake routing 34 so as to connect external electrode lands 37 which were connected by routing 29 in FIG. 2 to inverted fingers 33 for each external electrode 37. Thus, routing 34 is determined.

FIG. 4 illustrates a superimposing of the pattern of FIG. 2 formed on the first face 20a of a wiring substrate 20 and the pattern of FIG. 3 formed on the second face 20b thereof according to the above-mentioned procedure. When fingers 27 and 33, routing 29 and 34, and moreover, external electrode lands 37 are formed on the first and second faces of the wiring substrate, only one mask is required for pattern formation. In addition, an SMCP, cheaper than that of Embodiment 1, can be obtained using one layer of wiring pattern without a wiring substrate 20.

As shown in FIG. 4, since this semiconductor device can be constructed to have substantially the same length of routing 29 and 34 connecting each of external electrode lands 37 and fingers 27 and 33, no difference in impedance and thus substantially the same impedance can be attained. As for the patterns provided on a wiring substrate 20, different patterns as shown FIGS. 2 and 3 can be formed on the first face 20a and second face 20b, respectively. Alternatively, the same pattern as shown FIG. 4 can be formed on either side. Forming the same pattern is more preferable as it can distribute the load applied to semiconductor chips when a melt sealing resin is injected for sealing.

Next, the manufacturing procedure is described below. FIGS. 5A–5I show a manufacturing flow chart of the device in accordance with Embodiment 1.

First, as shown in FIG. 5A, paste an adhesive tape of a peripheral dimension substantially equal to that of semiconductor chip 22 that includes a cut-out of a dimension substantially equal to that of a through opening 21, or apply such bonding material 24a as a liquid adhesive resin for bonding a semiconductor chip (e.g. commercially available die bonding material) onto the second face 20b of a wiring substrate 20. Preferably, use adhesive material 24a that contains braided cloth base material (e.g. glass fiber base material) or tape-like base material (e.g. a polyimide tape and UV tape) capable of structuring the boding material having a stable thickness, and adhesive material coating, pasted or impregnated on the both faces of such a base material.

Second, as shown in FIG. 5B, fix a first semiconductor chip 22 onto the side of the second face 20b of a wiring substrate 20 via bonding material 24a. At this time, bond the semiconductor chip 22 with all the center pads 23 thereof are surrounded by a through opening 21. Thereafter, a step of curing the bonding material 24a (curing step) can be added as required.

Third, as shown in FIG. 5C, electrically connect center pads 23 on a semiconductor chip 22 to fingers 27 on wiring substrate 20 via metal wires 28 commonly used for semiconductor devices by ball bonding onto the center pads and by stitch bonding onto the fingers 27 using wire bonding method. The explanation of wire bonding method and the method of securing a semiconductor chip 22 and a wiring substrate 20 during wire bonding are omitted, as they are commonly known well.

Fourth, turn over the wring substrate 20 shown in FIG. 5C, and support the first face 20a of the wiring substrate 20 with a supporting block. The supporting block should have a recess on its supporting surface so that metal wires 28 are not brought into contact with the block because such contact may cause distortion of or application of external force to the wires. Then apply bonding material 24b to the back face 22b of the semiconductor chip 22.

Fifth, as shown in FIG. 5E, fix the back face 31b of a semiconductor chip 31 onto bonding material 24b. Thereafter, a step of curing bonding material 24b (curing step) can be added as required.

Sixth, as shown in FIG. 5F, electrically connect center pads 32 on semiconductor chip 31 to fingers 33 on a wiring substrate 20 via metal wires 28 by stitch bonding onto the center pads and by ball bonding onto the fingers using the wire bonding method. For a semiconductor chip 31 having center pads 32 placed at small spaces, perform ball bonding onto center pads 32 before wire bonding, cut the ball neck portions, and then perform stitch bonding onto the cut portions. (The detailed description of such a wire bonding method is also omitted, as it is conventionally known well.)

FIG. 5G shows the semiconductor device sealed with a sealing resin. As shown in the drawing, seal a first semiconductor chip 22, second semiconductor chip 31, bonding material 24a and 24b, metal wires 28, routing 34, and the predetermined portion of the second face of a wiring substrate 20 by covering them with sealing resin 35. Seal the predetermined portion of the first face 20a, through opening 21, fingers 27, and metal wires 28 by covering them with sealing resin 30. Since the upper and lower dies of a sealing die used for sealing are basically similar to those commonly used for plastic packaging, CSP, or BGA, the description is omitted.

In FIG. 5G, the step of sealing the semiconductor device with sealing resin 35 and sealing resin 30 at the same time is described. However, it is also possible to carry out sealing in two steps: sealing with sealing resin 30 and curing the sealing resin 30; and then sealing with sealing resin 35. As for sealing resins, any resin sealing material that has currently been developed can be used. In addition, not only the well-known transfer mold method but also the potting method can be used for sealing with sealing resin 30. (When no solder balls 36 need to be attached, the semiconductor device is completed after being subjected to the separation step in which bonded components are divided into separate pieces.

Next, the step of attaching solder balls is described. FIG. 5H shows the semiconductor device having solder balls 36 attached to external electrode lands 37 on the first face 20a of a wiring substrate 20. When attaching solder balls 36, support the wiring substrate so that the solder balls 36 face upward. Place a wiring substrate 20 on the supporting block so that the first face 20a of the wiring substrate 20 faces upward and to make external electrode lands 37 the uppermost face. Then apply soldering paste to the external electrode lands 37 using a solder mask and squeegee. Thereafter, place solder balls 36 onto the soldering paste applied. Fix the external electrode lands 37 and solder balls 36 together by so-called a series of reflow soldering procedure, e.g. passing the semiconductor device through a solder reflow furnace so as to melt the soldering paste in that condition.

In FIGS. 5A–5H, one SMCP is mounted on a wiring substrate 20 for the explanation of the manufacturing process. However, placement of a plurality of SMCPs in a plurality of lines and columns like a matrix on a wiring substrate 20 is easily possible and more efficient. It is preferable to perform the SMCP manufacturing process shown in Embodiment 1 in a plurality of SMCPs constructed on a wiring substrate 20 until the completion of the step of attaching solder balls.

After the completion of the step of attaching solder balls or the completion of the sealing step when attaching balls are not required, lastly, divide a plurality of SMCPs constructed on a wiring substrate 20 into separate pieces. As shown in FIG. 5I, the separation is performed using laser-cutting means along the vicinity of the periphery of sealing resin 35 provided on the second face 20b of a wiring substrate 20. The separation can be performed using such machining means as drilling or shearing, and such cutting means as grinding using a dicing blade.

A series of all the above-mentioned steps can easily and cheaply provide an SMCP that has two memory semiconductor chips of the same dimension with center pads stacked one on the other so as to double memory capacity as shown in FIG. 1. Shown above is only an example of a series of manufacturing steps. In the steps shown in FIGS. 5A through 5F, center pads 23 and fingers 27, and center pads 32 and fingers 33 may be electrically connected together, respectively, via gold wires using the wire bonding method, after the step of fixing a first semiconductor chip 22 and a second semiconductor chip 31 together via bonding material 24b. An SMCP semiconductor device produced with this procedure has the effect similar to that shown in Embodiment 1.

With the SMCP in accordance with Embodiment 1, its entire thickness is the sum of A1 (the dimension from the surface 31a of a second semiconductor chip 31 to the top surface of sealing resin 35), B (the total thickness of stacked chips 22 and 31 and bonding material 24b), and D1+C1 (the dimension from the surface 22a of a first semiconductor chip 22 to the tips of solder balls 36).

Figure 10:
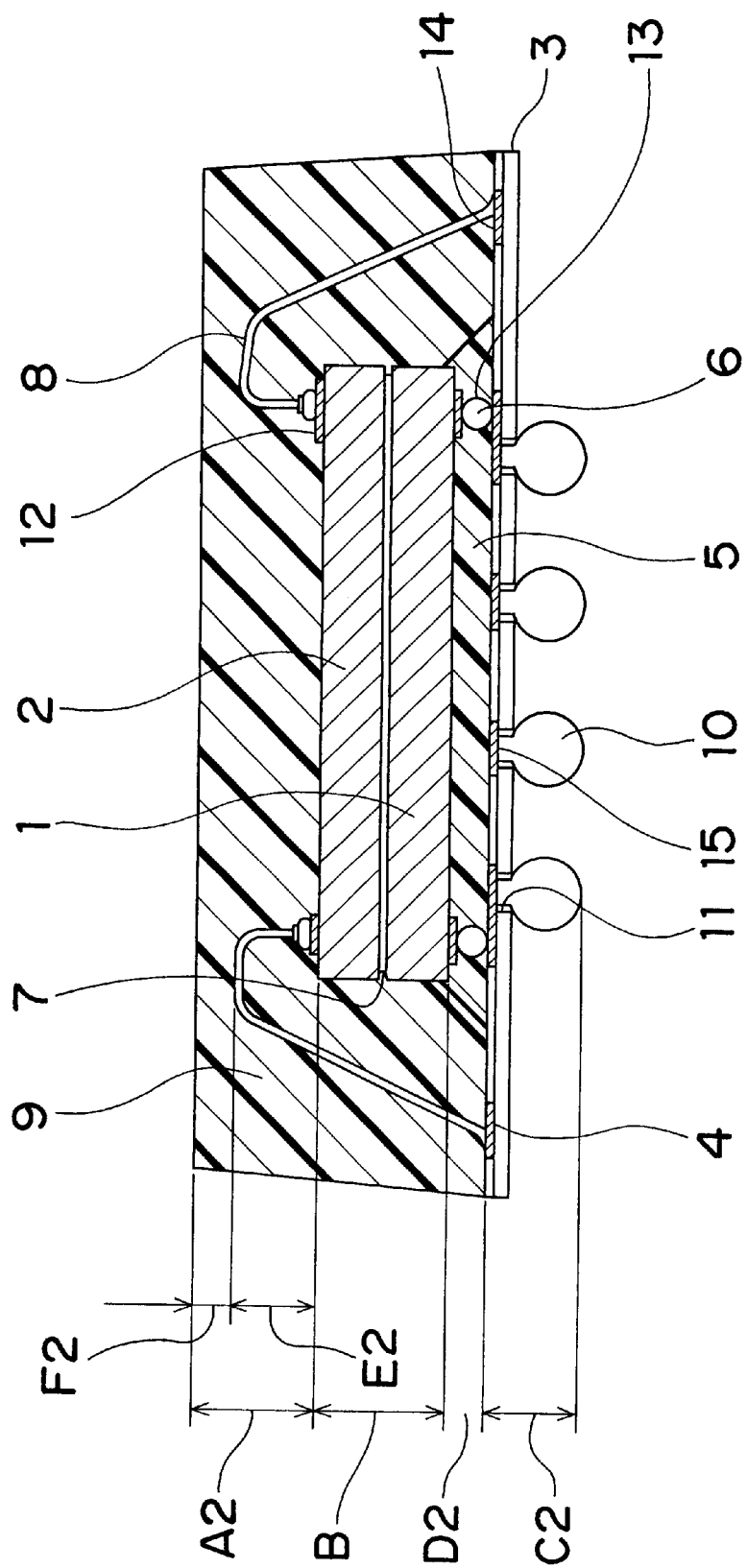
FIG. 10 is a cross sectional view illustrating the structure of another conventional semiconductor device.
Figure 11:
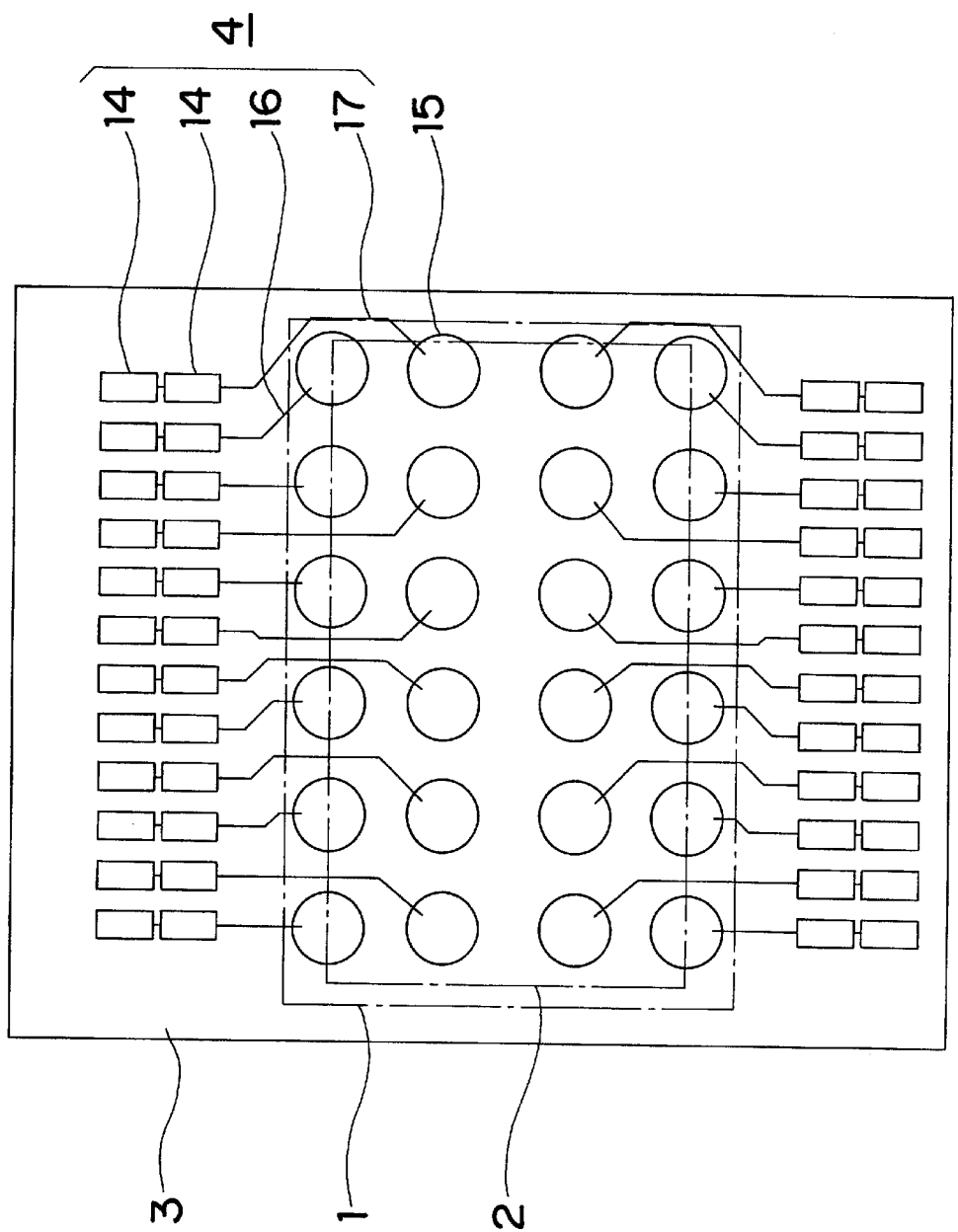
FIG. 11 is a top plan view of a wiring pattern of a wiring substrate used for the semiconductor device shown in FIG. 9.

In contrast, the entire thickness of the conventional SMCP shown in FIG. 10 is the sum of A2 (the dimension from the surface of a second semiconductor chip 2 to the top surface of sealing resin 9), B (the total thickness of stacked semiconductor chips 1 and 2 and bonding material 7), and D2+C2 (the dimension from the surface of a first semiconductor chip 1 to the tips of solder balls 10).

As an example, a comparison of the entire thickness is made between the SMCPs of FIG. 1 and FIG. 10, when the solder balls are 0.45 mm in diameter, the wiring substrate base is 0.1 mm in thickness, the wiring layer is 0.025 mm in thickness, the gold wire is 0.03 mm in diameter. The rising portion of the wire made by the common wire bonding E2=0.18 mm. The dimension from the top of the wire to the top surface of the sealing resin F2=0.08 mm. Thus, A2=0.26 mm. On the other hand, if it is assumed that the space between the main face 31a of the second semiconductor chip and the bottom face of gold wire 28 is 0.05 mm in FIG. 1, E1=0.09 mm. If it is assumed that F1=0.08 mm=F2, A1=0.17 mm. In FIG. 10, D2=0.085 mm and C2=solder ball diameter+substrate base thickness+wiring layer thickness= 0.45+0.1+0.025=0.575 mm.

In contrast, with the SMCP in accordance with Embodiment 1, D1=0.087 and C1=0.045+0.1+0.025+0.025=0.6 mm because of the wiring on both sides. Consequently, it is obvious that A1<A2 and D1+C1<D2+C2. This shows that the entire thickness of the SMCP in accordance with Embodiment 1 is 0.15 mm smaller than that of the conventional SMCP. In the comparison between FIG. 1 and FIG. 10, a description is made by assuming that the thickness of the semiconductor chips is the same. The thickness of a generally used semiconductor chip is 0.4 mm and that of a memory semiconductor chip is 0.3 mm. If chips are made to 0.25 mm in thickness, for example, the entire thickness can be made smaller than a conventional SMCP by 0.25 mm to 0.45 mm. Currently employed grinding techniques can form a semiconductor chip having a thickness of no more than 0.15 mm.

As a condition for constructing an SMCP in accordance with Embodiment 1, D1+C1>E1+F1 must be satisfied. Since D1+C1=0.685 mm as mentioned above, condition D1+C1>E1+F1 can be satisfied enough even when A2=E2+F2=0.26 mm shown in the conventional SMCP of FIG. 10 is used instead of E1+F1.

The through holes through a wiring substrate 20 of the device in accordance with Embodiment 1 can be placed so as aligned with the external electrode lands. Alternatively, the through holes and the lands can be placed eccentrically to each other or the through holes can be placed anywhere in the areas in which the external electrode lands are placed. The through holes can also be placed anywhere in the areas in which routing 29 or 34 is placed. Furthermore the through holes can be placed anywhere in the areas in which fingers 27 or 33 are placed depending on the condition. The positions in which through holes are formed through wiring substrate are not limited.

Embodiment 1 shows a construction having two semiconductor chips of the same dimension with center pads that are fixed back to back. However, using a first semiconductor chip having center pads and a second semiconductor chip of the same dimension having peripheral pads, a thin SMCP similar to that described in Embodiment 1 can be obtained.

Embodiment 2

Figure 6:
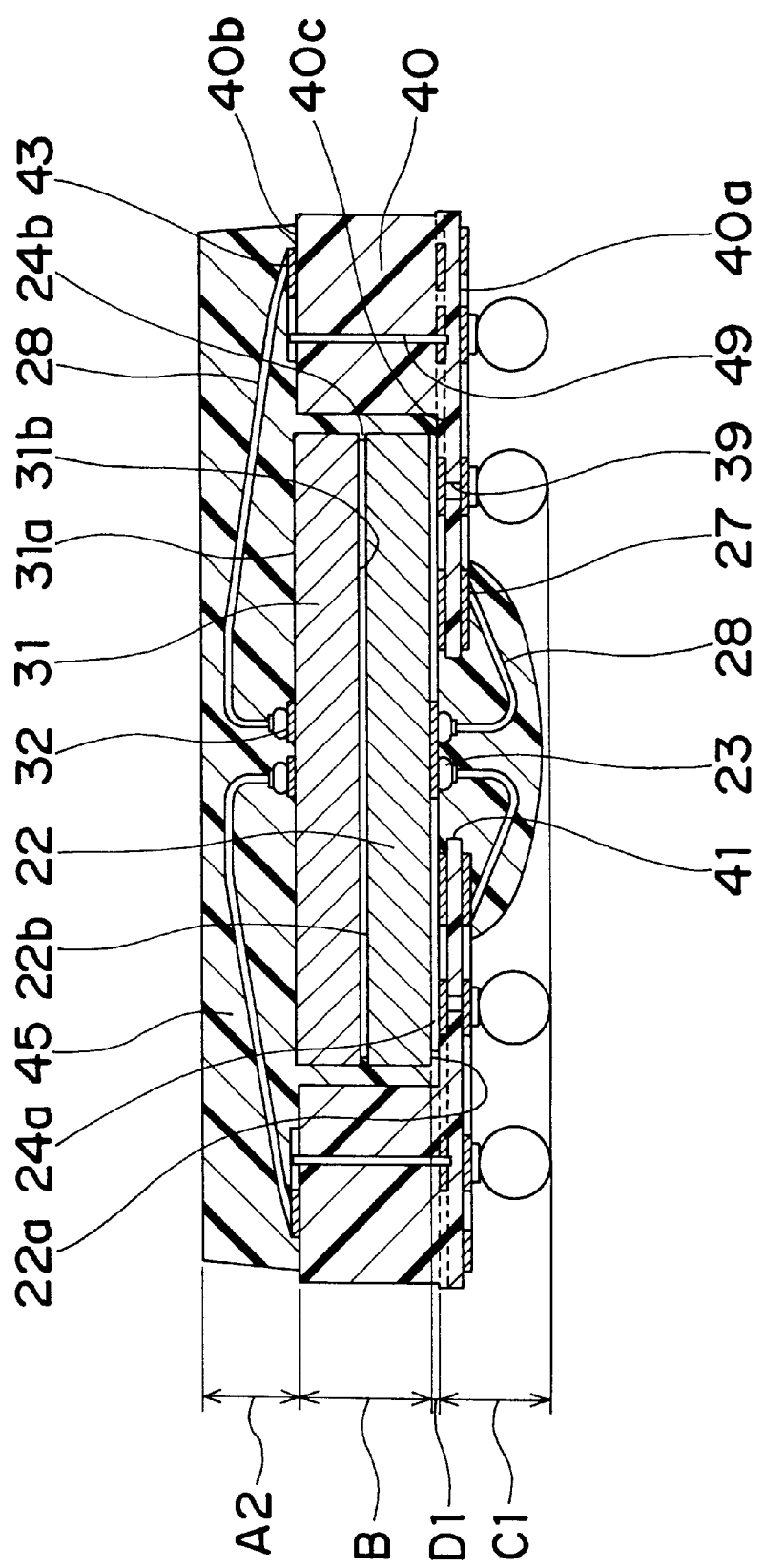
FIG. 6 is a cross sectional view illustrating the structure of a semiconductor device in accordance with Embodiment 2.
Figure 7:
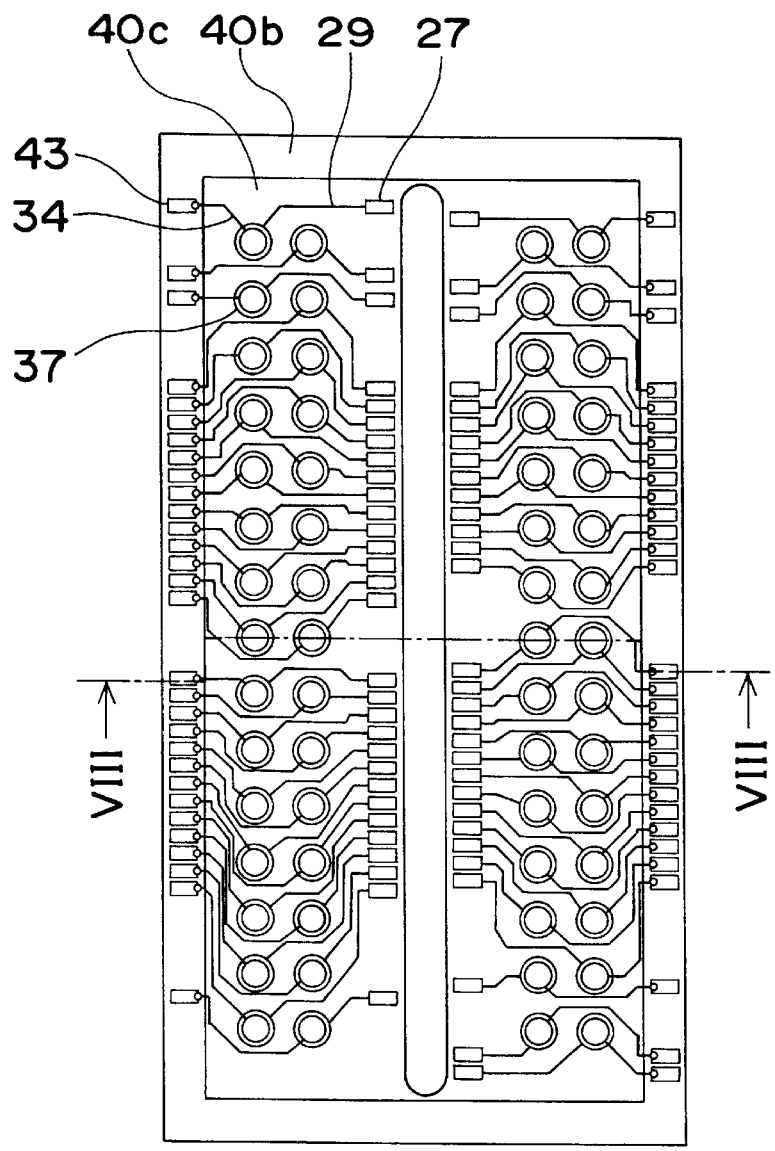
FIG. 7 is a top plan view of a wiring pattern provided on a second face of a wiring substrate used for the semiconductor device shown in FIG. 6.
Figure 8:
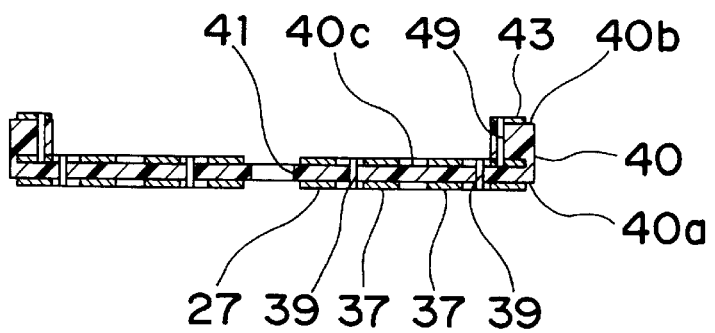
FIG. 8 is a cross sectional view taken in the direction of the arrows along line VIII—VIII of FIG. 7.
Figure 9:
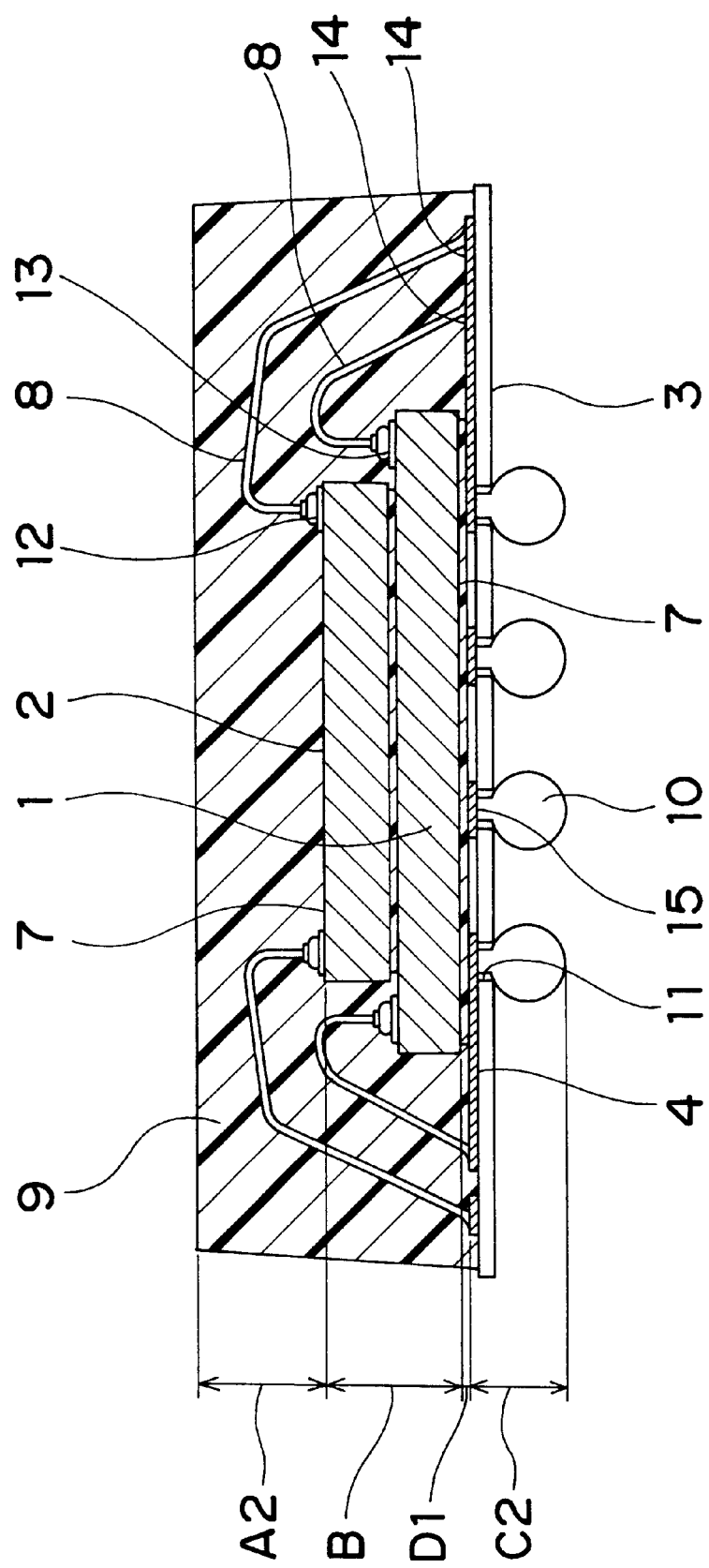
FIG. 9 is a cross sectional view illustrating the structure of a conventional semiconductor device.

Described is an example of an SMCP in which all the center pads are connected by ball bonding so as to double its memory capacity. This is implemented when the center pads are arranged at a fine pitch because the techniques of controlling the size of balls have been widely available. FIG. 6 is a cross sectional view illustrating Embodiment 2. FIG. 7 is a top plan view of a wiring substrate used in Embodiment 2, and FIG. 8 is a cross sectional view taken in the direction of arrows along line VIII—VIII of FIG. 7.

In FIG. 6 showing a semiconductor device in accordance with Embodiment 2, used is a wiring substrate 40 with a through opening 41 that has a first face 40a and a second face on the opposite side of the first face. The second face is composed of two surfaces: a projected surface 40b having a frame-like projection formed on a peripheral area of the second face; and a depressed surface 40c lower than the projected surface. Center pads 23 placed on the main face 22a of a first semiconductor 22 are surrounded by a through opening 41 provided through a depressed lower surface 40c and the rest of the lower surface is fixed to a first semiconductor chip using bonding material 24a. The back face 22b of the first semiconductor chip 22 and the back face 31b of a second semiconductor chip 31 are fixed together using bonding material 24b. The first and second semiconductor chips 22 and 31 are surrounded by the frame-like projection provided on the second face of a wiring substrate 40. The projected surface 40b and the main face 31a of the second semiconductor chip are constructed so as to be substantially flush with each other.

Fingers 43 provided on the projected surface 40b and center pads 32 on the second semiconductor chip 31 are connected to each other via metal wires 28. The center pads 23 on the first semiconductor chip 22 and fingers 27 provided on the first face 40a of the wiring substrate are connected to each other via metal wires 28. The metal wires 28, each of the semiconductor chips 22 and 31, the bonding material 24a and 24b, and the second face 40b and 40c of the wiring substrate 40 are sealed with sealing resin 45. As for the side of the first face 40a, through opening 41 and fingers 27 provided on the first face 40a in an area other than from land placement areas to peripheral areas are sealed.

As shown in FIG. 7, patterns on the first face 40a and second face 40b and 40c of a wiring substrate 40 used in Embodiment 2 include fingers 27 and 43, external electrode lands 37, and routing 29 and 34, which are completely the same as those provided on the first face 20a and second face 20b of a wiring substrate 20 used in Embodiment 1 shown in FIG. 4. The second face of a wiring substrate 40 used in Embodiment 2 is composed of two surfaces: a projected surface 40b having a frame-like projection surrounding the peripheral area of the second face; and a depressed surface 40c lower than the projected surface. As shown in FIG. 7, fingers 43 and through holes 49 are provided on a projected surface 40b. Specifically, the pattern to be provided on a projected surface 40b is easily made by cutting out the projection area from the pattern of the second face area to make the pattern of the projection area on a computer screen. Anyway, creation of the second face pattern based on the first face pattern on a computer screen can be easily performed using the procedure shown in Embodiment 1.

A depressed surface 40c lower than the projected surface has at least external electrode lands 37, through holes 39, and routing 29 and 43. In order to reduce the number of kinds of mask for pattern formation, providing a pattern similar to that of a first face 40a is preferable. Preparing different kinds of masks is more efficient: one is used to form a pattern of fingers 27 and 43 and external electrode lands 37, and the other is used to form a pattern of routing. Providing the same pattern on the first and second faces as shown in FIG. 7 is more preferable.

In the cross sectional view taken in the direction of the arrows along line VIII—VIII of FIG. 7 shown in FIG. 8, a projected surface 40b and a lower surface 40c are formed on the second face of a wiring substrate 40 by removing a part of the second face to make the bottom area and leave the projected surface. Preferably, spacers of the same base material are laminated which are used on the second face of the wiring substrate used in Embodiment 1 so as to construct a projected surface surrounding the periphery of the second face of the wiring substrate. Since the method of laminating is similar to that used for conventional laminated substrates, the description is omitted. For the wiring substrate used for this Embodiment 2, at least fingers 43 and through holes 49 are provided on the projected surface thereof. The object of providing through holes 49 is to electrically connect fingers 43 to external electrode lands 37 via the fingers provided on a lower surface 40c or routing 34. Since through holes 39 provided on a lower surface 40c have been detailed in Embodiment 1, the description is omitted.

The manufacturing process is also omitted, as it is the same as that of Embodiment 1. With Embodiment 2, as seen in comparison of FIG. 6 with FIG. 1, the shapes of a wiring substrate 40, sealing resin 45, and metal wires 28 are different. Especially, the connection between center pads and fingers via metal wires 28 is different. When a semiconductor chip has center pads placed at small spaces so as to have higher capacity and capability, ball bonding is performed on the center pad side using balls of a smaller diameter corresponding to the space between pads to avoid short circuits between the balls. Also, stitch bonding is performed on fingers 43 provided on the projected surface formed substantially flush with main face 31a of the semiconductor chip in order to avoid short circuits caused by the contact between metal wires and the chip.

Although FIGS. 7 and 8 show a projected surface 40b having an equal width and formed in the projection area, the projected surface is not limited to this shape.

Although through openings 41 are shown in sequence, openings in a parallel or serial arrangement can be used in the case for surrounding center pads. In addition, an SMCP even with a cross-shaped through opening has the effect similar to that of Embodiments 1 and 2, as long as the SMCP has center pads.

In order to reinforce the soldering joints or improve heat dissipation, the required number of dummy external electrode lands can be added to external electrode lands 37, as required. An SMCP with such a structure has the effect similar to that of Embodiments 1 and 2.

In addition, external electrode lands 37 can be placed in a staggered arrangement. Since the solder ball connections are subject to thermal strain when the device is mounted on a mounting substrate the lives of the solder joints are improved more than those of the SMCPs illustrated in Embodiments 1 and 2 with such an arrangement.

When a projected surface 40b in FIG. 7 has portions without fingers 43, providing reinforcements made of dummy wiring copper foil on the portions can reduce warpage of the wiring substrate or improve the mechanical strength thereof.

Depending on the positions of pads provided on semiconductor chips that are stacked one on the other, fingers can be placed on four sides of the projected surface.

In Embodiments 1 and 2, SMCPs each having two semiconductor chips of the same dimension that are bonded back to back are described. However, the effect similar to that of Embodiments 1 and 2 can be obtained as long as a first semiconductor chip having center pads is bonded to a second semiconductor chip using a wiring substrate having a through opening so that the opening surrounds the center pads, even when the second semiconductor chip has a dimension different from that of the first chip or has peripheral pads.

What is claimed is:

1. A semiconductor device comprising:
   a wiring substrate having a through opening, and lands, fingers, routing, through holes on a first face and a second face of said wiring substrate,
   a first semiconductor chip having center pads centrally located on a main face of said first semiconductor chip, wherein the second face of said wiring substrate and the main face of said first semiconductor chip are bonded to each other so that the through opening of said wiring substrate surrounds said center pads;
   a second semiconductor chip having pads, wherein a back face of said first semiconductor chip and a back face of said second semiconductor chip are fixed to each other using a bonding material;
   metal wires passing through the through opening in said wiring substrate and connecting said center pads on said first semiconductor chip to fingers corresponding to said center pads on the first face of said wiring substrate, and metal wires connecting said pads on said second semiconductor chip to fingers corresponding to said pads on the second face of said wiring substrate; and
   sealing resin encapsulating said metal wires, said first and second semiconductor chips, and filling the through opening.

2. The semiconductor device according to claim 1 including solder balls on the lands on the first face of said wiring substrate.

3. The semiconductor device according to claim 1 wherein said first semiconductor chip and said second semiconductor chip are identical to each other.

4. A semiconductor device comprising:
   a wiring substrate having a through opening, and lands, fingers, routing, through holes on a first face and a second face of said wiring substrate;
   a first semiconductor chip having center pads on a main face of said first semiconductor chip, wherein said wiring substrate and said first semiconductor chip are fixed to each other using a bonding material so that the through opening of said wiring substrate surrounds said center pads;
   a second semiconductor chip having pads, wherein a back face of said first semiconductor chip and a back face of said second semiconductor chip are fixed to each other using a bonding material;
   metal wires connecting said pads on each of said first and second semiconductor chips and fingers corresponding to said pads on said wiring substrate; and
   a sealing resin encapsulating said metal wires, said first and second semiconductor chips, and said bonding materials, and filling the through opening, wherein
   said fingers are sealed in an area other than an area extending from land placement areas on the first face of said wiring substrate to peripheral areas,
   said center pads on said first semiconductor chip are connected to said fingers on the first face of said wiring substrate via gold wires by ball bonding to said center pads and by stitch bonding to said fingers, and
   said fingers on the second face of said wiring substrate are connected to said pads on said second semiconductor chip via gold wires by ball bonding to said fingers and by stitch bonding to said pads.

5. A semiconductor device comprising:
   a wiring substrate having a through opening, and lands, fingers, routing, through holes on a first face and a second face of said wiring substrate;
   a first semiconductor chip having center pads on a main face of said first semiconductor chip, wherein said wiring substrate and said first semiconductor chip are fixed to each other using a bonding material so that the through opening of said wiring substrate surrounds said center pads;
   a second semiconductor chip having pads, wherein a back face of said first semiconductor chip and a back face of said second semiconductor chip are fixed to each other using a bonding material;

metal wires connecting said pads on each of said first and second semiconductor chips and fingers corresponding to said pads on said wiring substrate; and a sealing resin encapsulating said metal wires, said first and second semiconductor chips, and said bonding materials, and filling the through opening, wherein
said fingers are sealed in an area other than an area extending from land placement areas on the first face of said wiring substrate to peripheral areas,
a first group of said fingers are located in the vicinity of and substantially parallel to the through opening and corresponding lands are arranged outside of and parallel to said first group of said fingers in a plurality of uniformly spaced lines on the first face of said wiring substrate, and
a second group of said fingers are located in the vicinity of and parallel to a periphery of said wiring substrate and corresponding lands are arranged inside of and substantially parallel to said second group of said fingers in a plurality of uniformly spaced lines on the second face of said wiring substrate.

6. A semiconductor device comprising:

a wiring substrate having a through opening, and lands, fingers, routing, through holes on a first face and a second face of said wiring substrate;

a first semiconductor chip having center pads on a main face of said first semiconductor chip, wherein said wiring substrate and said first semiconductor chip are fixed to each other using a bonding material so that the through opening of said wiring substrate surrounds said center pads;

a second semiconductor chip having pads, wherein a back face of said first semiconductor chip and a back face of said second semiconductor chip are fixed to each other using a bonding material;

metal wires connecting said pads on each of said first and second semiconductor chips and fingers corresponding to said pads on said wiring substrate; and a sealing resin encapsulating said metal wires, said first and second semiconductor chips, and said bonding materials, and filling the through opening, wherein
said fingers are sealed in an area other than an area extending from land placement areas on the first face of said wiring substrate to peripheral areas,
some of said fingers are located in the vicinity of, along, and substantially parallel to the through opening, and
some of said lands are arranged along a periphery of said wiring substrate in a plurality of lines at equal distances in areas between the periphery and said fingers.

7. A semiconductor device comprising:

a wiring substrate having a first face and a second face, the second face including a frame-like surface at a peripheral area and having fingers, and a central surface within the frame-like surface and in a different plane from the frame-like surface, said first face and said central surface of the second face having a through opening, lands, fingers, routing, and through holes;

first and second semiconductor chips, both having center pads centrally located on main surfaces of said first and second semiconductor chips, said first and second semiconductor chips being bonded to each other, back to back, and to said wiring substrate so that the main face of said first semiconductor chip is fixed to the central surface of said wiring substrate and the through opening surrounds said center pads of said first semiconductor chip, and the main face of said second semiconductor chip is substantially flush with the frame-like surface;

metal wires electrically connecting said center pads on said first and second semiconductor chips to said fingers on said wiring substrate via ball bonding to said center pads and by stitch bonding to said fingers, and sealing resin encapsulating said metal wires, said first and second semiconductor chips, and the second face of said wiring substrate, and filling the through opening.

8. The semiconductor device according to claim 7 including solder balls on the lands on the first face of said wiring substrate.

9. The semiconductor device according to claim 1 wherein said sealing resin includes a first body of sealing resin encapsulating said first and second semiconductor chips and second body of sealing resin filling the through hole, said first and second bodies of sealing resin not contacting each other.

10. The semiconductor device according to claim 7 wherein some of said metal wires pass through the through opening in said wiring substrate, connecting said center pads on said first semiconductor fingers corresponding to said center pads of said first semiconductor chip on the first face of said wiring substrate, and some of said metal wires connect said center pads on said second semiconductor chip to fingers corresponding to said center pads of said second semiconductor chip on the frame-like surface.

11. The semiconductor device according to claim 7 wherein said sealing resin includes a first body of sealing resin encapsulating said first and second semiconductor chips and second body of sealing resin filling the through hole, said first and second bodies of sealing resin not contacting each other.

12. The semiconductor device according to claim 7 wherein said first semiconductor chip and said second semiconductor chip are identical to each other.

* * * * *